United States Patent
Chou et al.

(10) Patent No.: US 7,129,623 B2
(45) Date of Patent: Oct. 31, 2006

(54) PIEZOELECTRIC BLADE PROTECTION STRUCTURE

(75) Inventors: Chin-Wen Chou, Taipei Hsien (TW); Ying-Nan Cheng, Taipei Hsien (TW)

(73) Assignee: Zippy Technology Corp., Hsin Tien (TW)

(*) Notice: Subject to any disclaimer, the term of this patent is extended or adjusted under 35 U.S.C. 154(b) by 202 days.

(21) Appl. No.: 10/889,004

(22) Filed: Jul. 13, 2004

(65) Prior Publication Data

US 2006/0012267 A1    Jan. 19, 2006

(51) Int. Cl.
*H01L 41/053* (2006.01)
(52) U.S. Cl. .................. 310/346; 310/341; 310/342; 310/348
(58) Field of Classification Search ........ 310/340–342, 310/345, 346, 348; 361/690, 692; 174/52.1
See application file for complete search history.

(56) References Cited

U.S. PATENT DOCUMENTS 4,998,549 A * 3/1991 Bran ........................... 134/184
5,847,490 A * 12/1998 Kumasaka et al. ........... 310/348
5,875,795 A * 3/1999 Bouix ......................... 132/293
6,504,095 B1 * 1/2003 Hoffstrom ................... 174/52.1
2004/0135473 A1 * 7/2004 Byers et al. ................. 310/348

FOREIGN PATENT DOCUMENTS

JP         11-354971         * 12/1999

* cited by examiner

*Primary Examiner*—Thomas M. Dougherty
(74) *Attorney, Agent, or Firm*—Birch Stewart Kolasch & Birch, LLP

(57) ABSTRACT

A piezoelectric blade protection structure for a plurality of juxtaposed piezoelectric blades mounting onto a circuit board to provide protection and anchoring effect for the piezoelectric blades. A protection member is mounted onto the vibration nodes of the piezoelectric blades to prevent the piezoelectric blades from broken by improper impact of external forces. The protection member, piezoelectric blades and circuit board are interposed respectively by a upper elastic element and a lower elastic element to provide a desired vibration space and anchoring for the piezoelectric blades.

6 Claims, 7 Drawing Sheets

PIEZOELECTRIC BLADE PROTECTION STRUCTURE

FIELD OF THE INVENTION

The present invention relates to a piezoelectric blade protection structure and particularly to a structure to provide protection, anchoring and a desired vibration space for a plurality of juxtaposed piezoelectric blades.

BACKGROUND OF THE INVENTION

In order to enable piezoelectric blade assemblies mounted onto a circuit board to maintain desired vibration and performance, a conventional approach as shown in FIG. 1 is to add a protection frame 20' above a piezoelectric blade 10'. And the piezoelectric blade 10' and the protection frame 20' are interposed by an elastic element 30' therebetween on the vibration node to prevent the piezoelectric blade 10' from being compressed by external forces and broken, and also allow the piezoelectric blade 10' to be anchored more securely. However such a structure still has drawbacks, notably:

1. The protection frame 20' has to individually cover the piezoelectric blade 10'. For a structure that has many sets of piezoelectric blade 10' laid in a juxtaposed manner, fabrication process and time increase. The cost for producing many protection frames 20' also increases.

2. The protection frame 20' generally completely covers the piezoelectric blade 10'. Heat energy generated by vibration of the piezoelectric blade 10' cannot be dispersed. Moreover, the piezoelectric blade 10' also produces friction noise during vibration. The sealed protection frame 20' creates acoustic chest effect and results in excessive noise during operation of the piezoelectric blade 10'.

3. Different loads (such as cold cathode fluorescent lamps) require different output powers of the piezoelectric blade 10' (such as different length and luminosity). Hence the number of layers of the piezoelectric blade 10' varies. The height of single sheet or laminated piezoelectric blade 10' has to change according to the load condition. As a result, different heights of protection frame 20' have to be designed to match the piezoelectric blade modules of different specifications and heights. The number of specifications of the protection frame 20' increases and the fabrication is higher.

SUMMARY OF THE INVENTION

The primary object of the present invention is to solve the aforesaid disadvantages. The invention provides a protection structure that is applicable to a plurality of juxtaposed piezoelectric blades, not fully sealed and adaptable to different heights of piezoelectric blades.

To achieve the foregoing object, the protection structure according to the invention is located on the vibration nodes of the piezoelectric blades to prevent the piezoelectric blades from broken when subject to improper external impacts and has upper elastic elements interposed between the protection member and the piezoelectric blades, and lower elastic elements interposed between the piezoelectric blades and a circuit board to provide a desired vibration space and anchoring effect.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
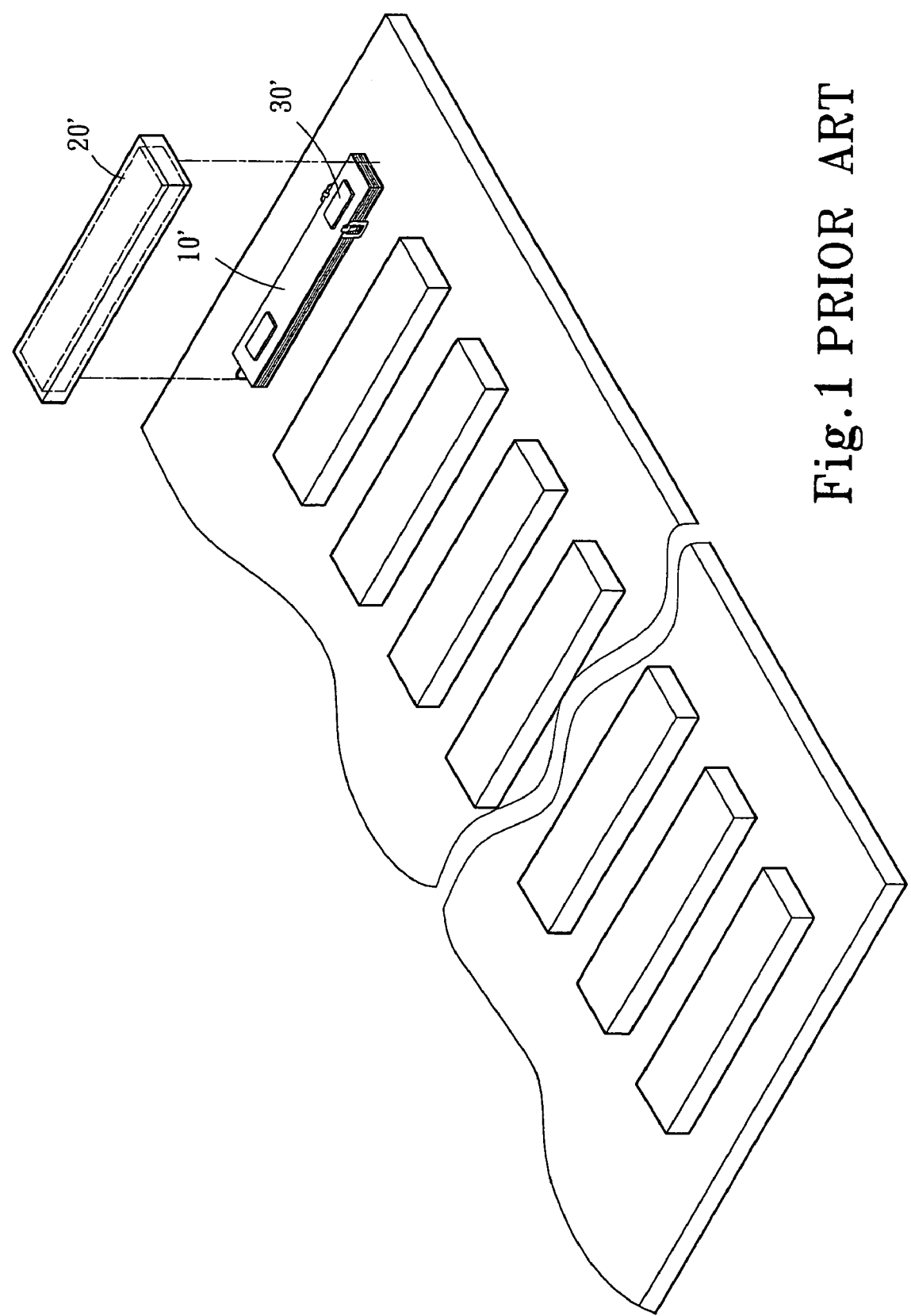
FIG. 1 is a perspective view of a conventional protection frame.
Figure 2:
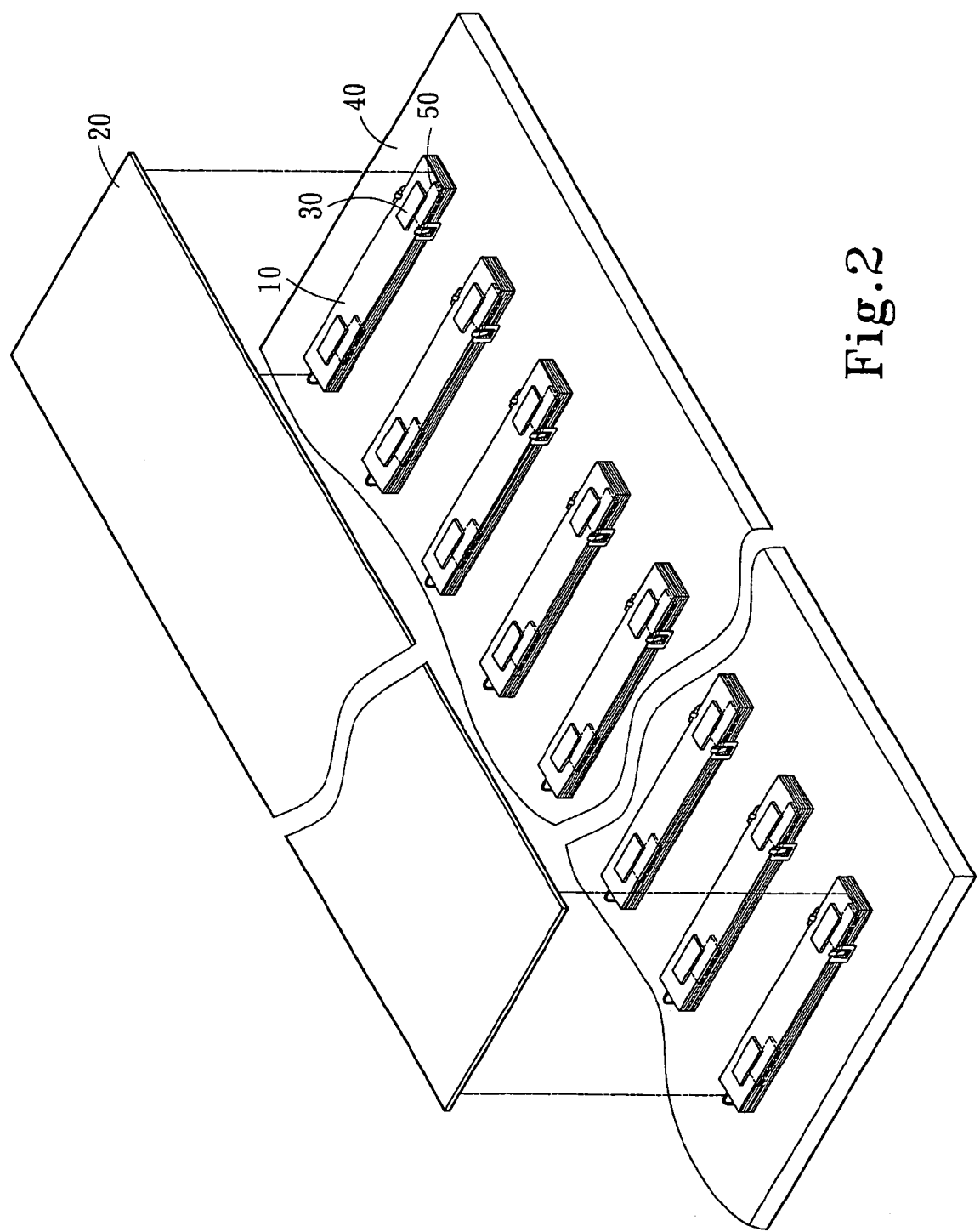
FIG. 2 is a schematic view of a first embodiment of the present invention.

Please refer to FIG. 2 for a first embodiment of the present invention. A piezoelectric blade 10 which may be a single layer or a laminated type is mounted onto a circuit board 40. The piezoelectric blade 10 and the circuit board 40 are interposed by a lower elastic element 50. A protection member 20 is located on the vibration nodes of the piezoelectric blade 10. The protection member 20 and the piezoelectric blade 10 are interposed by a upper elastic element 30. By means of such a structure, the piezoelectric blade 10 has a desired vibration space and anchoring effect. The protection member 20 is formed from one sheet to fully cover the piezoelectric blade 10, thus overcomes the problem of mounting individual protection frames occurred to the conventional technique.

The protection member 20 is mounted onto the piezoelectric blade 10 and coupled on the circuit board 40. However, the protection member 20 does not completely seal the piezoelectric blade 10. Hence the heat energy generated by the piezoelectric blade 10 during vibration can be dispersed immediately to prevent heat accumulation and overheat that may result in damage of the piezoelectric blade 10. The noise caused by acoustic chest effect also may be avoided. In addition, as the protection member 20 is located on the vibration nodes of the piezoelectric blade 10, and does not fully seal the piezoelectric blade 10, when a load requires a different output power from the piezoelectric blade 10, and the number of layers or height of the corresponding piezoelectric blade 10 may be altered, and the protection member 20 may be adapted easily. There is no need to prepare many specifications of different sizes and heights for the protection member 20. Hence the fabrication cost may be reduced.

Moreover, as the protection member 20 is located on the vibration nodes of the piezoelectric blade 10, it can provide the shield effect as the conventional protection fame does and prevent the piezoelectric blade 10 from broken caused by improper external forces. The upper and lower elastic elements 30 and 50 interposed between the piezoelectric blade 10, the protection member 20 and the circuit board 40 are also located on the vibration nodes of the piezoelectric blade 10, and can provide a desired vibration space.

Figure 3:
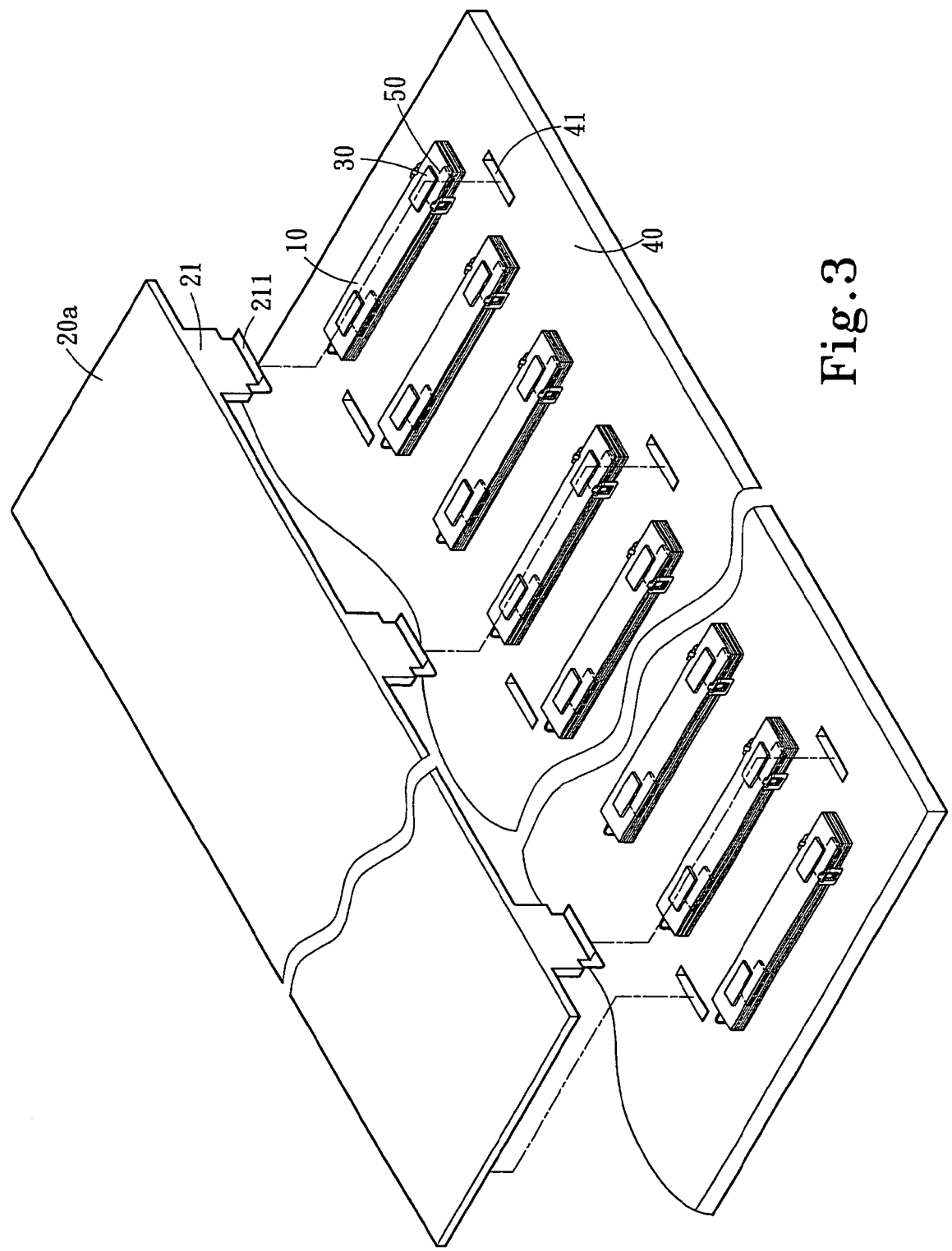
FIG. 3 is a schematic view of a second embodiment of the present invention.

Refer to FIG. 3 for a second embodiment of the invention. It differs from the first embodiment by having a latch section 21 extended from the protection member 20a towards the circuit board 40. The latch section 21 has a hook 211 to couple with a corresponding anchor slot 41 formed on the circuit board 40 to achieve a more secured anchoring effect.

Figure 4:
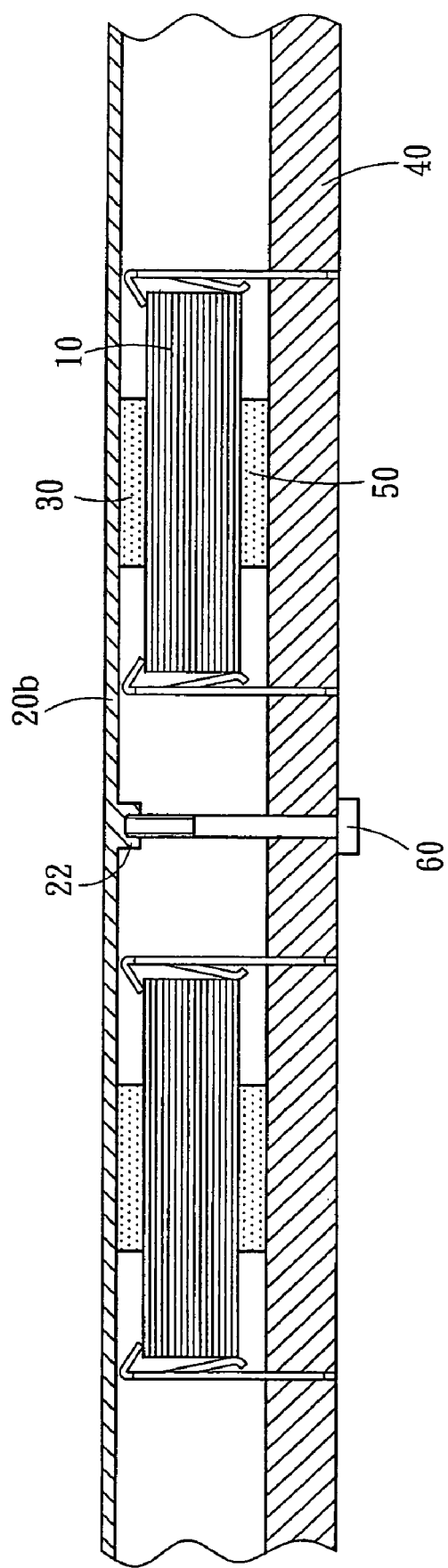
FIG. 4 is a schematic view of a third embodiment of the invention.

Refer to FIG. 4 for a third embodiment of the invention. It differs from the second embodiment by having a fastening section 22 extended from the protection member 20b towards the circuit board 40. A fastening element 60 may run through the circuit board 40 to fasten the protection member 20b to the circuit board 40 to achieve the anchoring effect.

Figure 5:
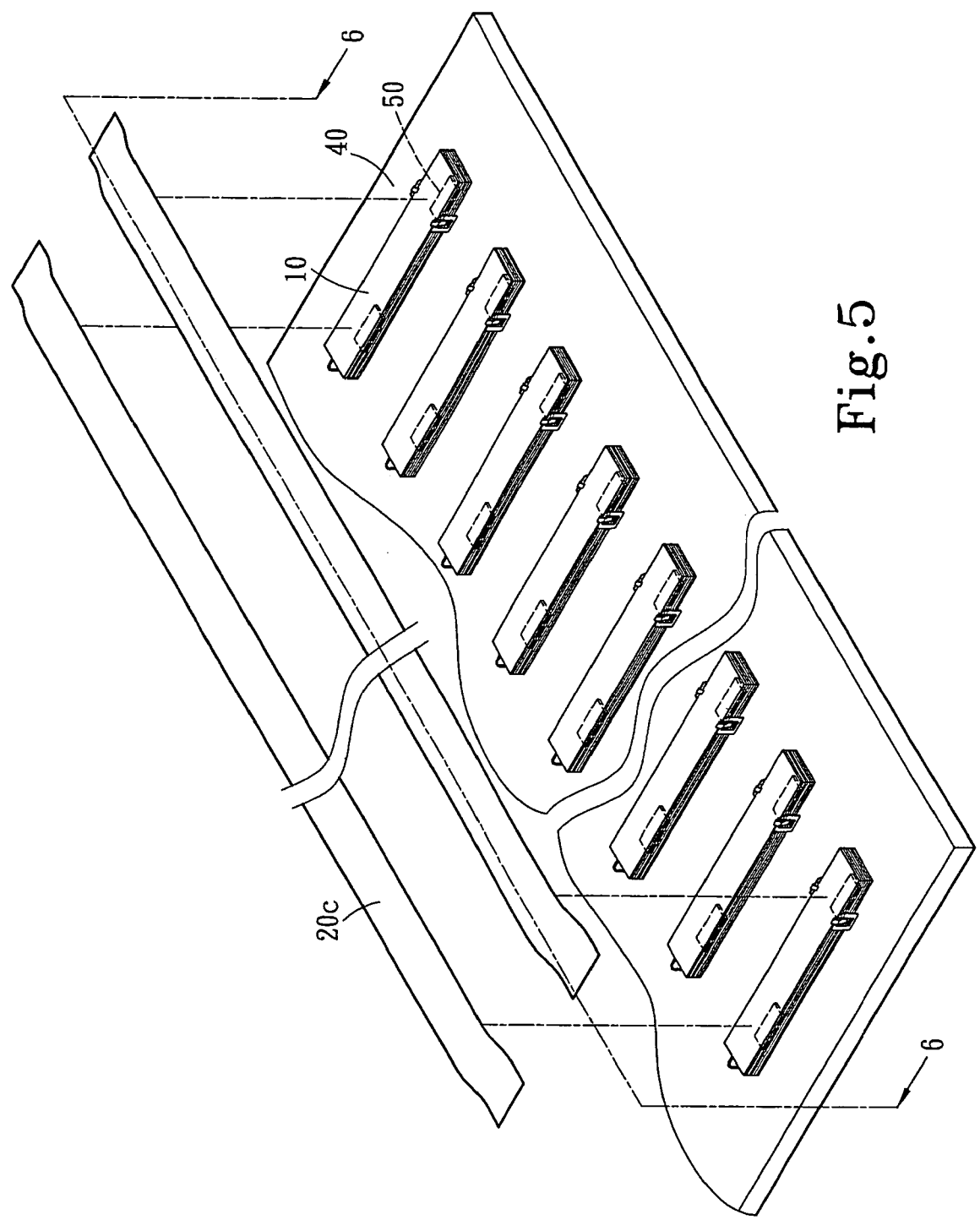
FIG. 5 is a schematic view of a fourth embodiment of the invention.
Figure 6:
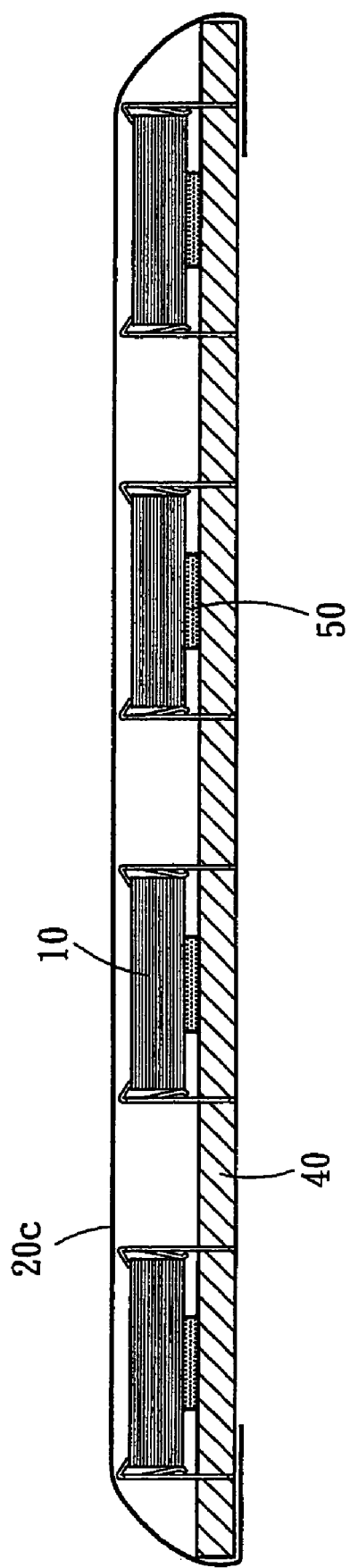
FIG. 6 is a cross section according to FIG. 5.

Refer to FIGS. 5 and 6 for a fourth embodiment of the invention. The protection member 20c is made from plastics and is flexible. It is bonded to the vibration nodes of the piezoelectric blade 10. It has two ends bonding to the circuit board 40 for anchoring. Its flexibility provides a desired vibration room for the piezoelectric blade 10, and also reduces the number of elastic elements 30 needed and the fabrication process.

Figure 7:
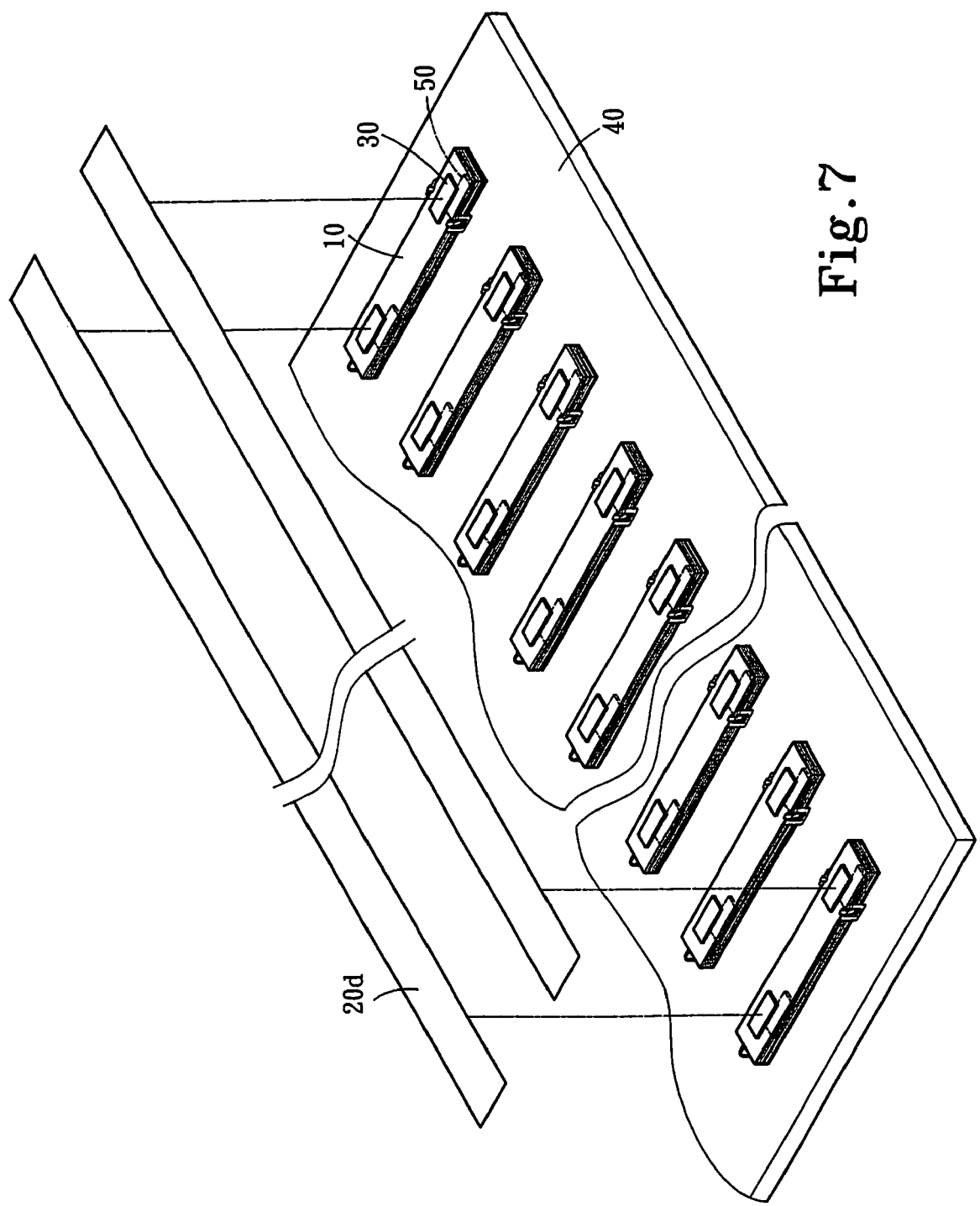
FIG. 7 is a schematic view of a fifth embodiment of the invention.

Refer to FIG. 7 for a fifth embodiment of the invention. It differs from the first embodiment by having the protection member 20d to cover only the vibration nodes of the piezoelectric blade 10 rather than the entire piezoelectric blade 10. It may function equally well. Details are omitted.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A piezoelectric blade protection structure for a plurality of juxtaposed piezoelectric blades mounted onto a circuit board having a lower elastic element interposed therebetween, comprising a protection member mounting onto vibration nodes of the piezoelectric blades in an unsealed fashion.

2. The piezoelectric blade protection structure of claim 1, wherein the protection member has a latch section extended towards the circuit board which has an anchor slot engageable with a corresponding hook formed on the latch section.

3. The piezoelectric blade protection structure of claim 1, wherein the protection member and the piezoelectric blades are interposed by a upper elastic element.

4. The piezoelectric blade protection structure of claim 1, wherein the protection member is made from plastics and flexible and bonded to the vibration nodes of the piezoelectric blades.

5. The piezoelectric blade protection structure of claim 1, wherein the protection member has a fastening section extended towards the circuit board to engage with a fastening element to fasten the protection member to the circuit board.

6. The piezoelectric blade protection structure of claim 4, wherein the protection member and the piezoelectric blades are interposed by a upper elastic element.

* * * * *